US012795970B2

(12) United States Patent
Cheng

(10) Patent No.: US 12,795,970 B2
(45) Date of Patent: Nov. 10, 2026

(54) SEMICONDUCTOR STRUCTURE AND MANUFACTURING METHOD THEREOF

(71) Applicant: Enkris Semiconductor, Inc., Suzhou (CN)

(72) Inventor: Kai Cheng, Suzhou (CN)

(73) Assignee: Enkris Semiconductor, Inc., Suzhou (CN)

( * ) Notice: Subject to any disclaimer, the term of this patent is extended or adjusted under 35 U.S.C. 154(b) by 309 days.

(21) Appl. No.: 18/795,737

(22) Filed: Aug. 6, 2024

(65) Prior Publication Data

US 2025/0194129 A1 Jun. 12, 2025

(30) Foreign Application Priority Data

Dec. 12, 2023 (CN) ........................ 202311698686.1

(51) Int. Cl.

| | |
|---|---|
| ***H10D 30/01*** | (2025.01) |
| ***H10D 30/47*** | (2025.01) |
| ***H10D 62/85*** | (2025.01) |
| ***H10D 64/23*** | (2025.01) |
| ***H10D 64/27*** | (2025.01) |

(52) U.S. Cl.

CPC ....... *H10D 30/015* (2025.01); *H10D 30/4755* (2025.01); *H10D 62/8503* (2025.01); *H10D 64/258* (2025.01); *H10D 64/411* (2025.01)

(58) Field of Classification Search

CPC ............. H10D 30/015; H10D 30/4755; H10D 62/8503; H10D 64/258; H10D 64/411

See application file for complete search history.

(56) References Cited

U.S. PATENT DOCUMENTS

2007/0132037 A1* 6/2007 Hoshi .................. H10D 30/015 257/E29.253
2008/0258150 A1* 10/2008 McCarthy ............ H10D 30/015 257/E21.333

(Continued)

FOREIGN PATENT DOCUMENTS

CN 210467851 U 5/2020
CN 113113476 A 7/2021

(Continued)

OTHER PUBLICATIONS

Notice of Grant of Invention Patent Right for Chinese Application No. 202311698686.1, dated Oct. 31, 2025 (Oct. 31, 2025)—3 pages (English Translation—3 pages).

*Primary Examiner* — Ismail A Muse
(74) *Attorney, Agent, or Firm* — CM Law PLLC; Stephen J. Weed

(57) ABSTRACT

A semiconductor structure includes a substrate, a channel structure, a first groove, an insertion layer, and a heavily doped material layer. The channel structure is located on the substrate. The channel structure includes a channel layer and a barrier layer. The channel structure includes a gate region, a source region and a drain region. The source region and the drain region are located on two sides of the gate region. The first groove is located in the source region and the drain region. The first groove penetrates at least the barrier layer. The insertion layer is disposed in the barrier layer. The recessed trench is in communication with the first groove. The heavily doped material layer fills the first groove and the recessed trench.

20 Claims, 10 Drawing Sheets

(56) References Cited

U.S. PATENT DOCUMENTS

| | | | | |
|---|---|---|---|---|
| 2012/0248500 | A1* | 10/2012 | Kajitani ............... | H10D 30/475<br>257/E21.09 |
| 2015/0221760 | A1* | 8/2015 | Kub ..................... | H10D 30/014<br>438/172 |
| 2019/0326404 | A1* | 10/2019 | Kumazaki ............ | H10D 30/015 |
| 2023/0077826 | A1 | 3/2023 | Cheng | |

FOREIGN PATENT DOCUMENTS

| | | | |
|---|---|---|---|
| CN | 113628962 | A | 11/2021 |
| WO | 2015055108 | A1 | 4/2015 |

* cited by examiner

SEMICONDUCTOR STRUCTURE AND MANUFACTURING METHOD THEREOF

CROSS-REFERENCE TO RELATED APPLICATION(S)

This application claims priority to Chinese Patent Application No. 202311698686.1 filed Dec. 12, 2023, the disclosure of which is incorporated herein by reference in its entirety.

TECHNICAL FIELD

Embodiments of the present invention relate to the field of semiconductor technology and, in particular, to a semiconductor structure and a manufacturing method thereof.

BACKGROUND

During the manufacturing process of a GaN-based HEMT device, a source-drain ohmic contact process is one of key technologies, which directly affects the frequency and power performance of the device. The secondary epitaxial growth of n-type heavily doped GaN in an ohmic contact region has become a new international process in recent years to reduce ohmic contact resistivity and improve a surface morphology.

At present, the secondary epitaxial growth of n-type heavily doped GaN is mainly implemented by molecular beam epitaxy (MBE), but some people also use a metal-organic chemical vapor deposition (MOCVD) method. The ohmic contact resistance implemented in this method mainly includes the contact resistance between metal and n-type heavily doped GaN, the bulk resistance of the n-type heavily doped GaN, and the contact resistance between the n-type heavily doped GaN and the sidewall of a channel structure. The quality of the contact between the n-type heavily doped GaN and the sidewall of the channel structure directly affects the contact resistance between the n-type heavily doped GaN and the sidewall of the channel structure. The contact resistance has the greatest impact on the overall ohmic contact. FIG. 1 is a sectional view after the second epitaxial growth of a heavily doped GaN material in the existing art. As shown in FIG. 1, a buffer layer 2, a GaN channel layer 3, and a barrier layer 4 are stacked on a substrate 1. The GaN channel layer 3 and the barrier layer 4 form a channel structure. A patterned SiO2 layer 5 is used as a mask. The exposed barrier layer 4 and the GaN channel layer 3 are etched in sequence to a depth below a GaN heterojunction interface. In the actual operation process, due to the problem of etching accuracy, it is easy to cause over-etching of the channel structure. The side position of the channel structure is recessed by a certain distance relative to the mask layer SiO2 layer 5 above the channel structure. During the secondary epitaxial growth of a heavily doped GaN material 6, due to the over-etching, the side of the heavily doped GaN material 6 is in poor contact with the channel structure. As a result, the contact resistance between the n-type heavily doped GaN material 6 and the sidewall of the channel structure greatly increases. Thus, the effective reduction of the contact resistance between the n-type heavily doped GaN material 6 and the sidewall of the channel structure is of great significance in reducing the overall ohmic contact.

SUMMARY

Embodiments of the present invention provide a semiconductor structure and a manufacturing method thereof to reduce the contact resistance between a heavily doped material layer and the sidewall of a channel structure.

According to an aspect of the present invention, a semiconductor structure is provided. The semiconductor structure includes a substrate, a channel structure, a first groove, an insertion layer, and a heavily doped material layer.

The channel structure is located on the substrate. The channel structure includes a channel layer and a barrier layer formed on the substrate in sequence. The channel structure includes a gate region, a source region and a drain region. The source region and the drain region are located on two sides of the gate region.

The first groove is located in the source region and the drain region. The first groove penetrates at least the barrier layer.

The insertion layer is disposed in the barrier layer. The sidewalls of the insertion layer located at ends of the source region and the drain region are recessed by a preset distance relative to the sidewalls of the barrier layer to form a recessed trench. The recessed trench is in communication with the first groove.

The heavily doped material layer fills the first groove and the recessed trench.

According to another aspect of the present invention, a manufacturing method of a semiconductor structure is provided. The method includes the steps below.

The substrate is provided.

The channel structure is formed on a side of the substrate. The formation of the channel structure includes forming the channel layer and the barrier layer on the substrate in sequence. The channel structure includes a gate region, a source region and a drain region. The source region and the drain region are located on two sides of the gate region. The formation of the barrier layer includes etching the channel structure in the barrier layer to form the first groove. The first groove penetrates at least the barrier layer.

The sidewall of the insertion layer is laterally etched. Thus, the sidewalls of the insertion layer located at ends of the source region and the drain region are recessed by the preset distance relative to the sidewalls of the barrier layer to form the recessed trench. The recessed trench is in communication with the first groove.

The heavily doped material layer is formed in the first groove. The heavily doped material layer fills the first groove and the recessed trench.

BRIEF DESCRIPTION OF DRAWINGS

To illustrate solutions in embodiments of the present invention more clearly, the accompanying drawings used in description of the embodiments are described below. Apparently, the accompanying drawings described below illustrate only part of embodiments of the present invention, and those skilled in the art may obtain other accompanying drawings based on the accompanying drawings described below on the premise that no creative work is done.

DETAILED DESCRIPTION

For a better understanding of the solution of the present invention by those skilled in the art, the technical solutions in embodiments of the present invention are described clearly and completely in conjunction with the drawings in the embodiments of the present invention. Apparently, the embodiments described are part, not all, of the embodiments of the present invention. Based on the embodiments described herein, all other embodiments obtained by those skilled in the art on the premise that no creative work is done are within the scope of the present invention.

It is to be noted that the terms "first", "second" and the like in the description, claims and drawings of the present invention are used to distinguish between similar objects and are not necessarily used to describe a particular order or sequence. It should be understood that the data used in this way is interchangeable where appropriate so that the embodiments of the present invention described herein can also be implemented in a sequence not illustrated or described herein. In addition, the terms "include", "have" and any other variations thereof are intended to encompass a non-exclusive inclusion. For example, a process, method, system, product, or equipment that includes a series of steps or units not only includes the expressly listed steps or units but may also include other steps or units that are not expressly listed or are inherent to such process, method, product or equipment.

Figure 1:
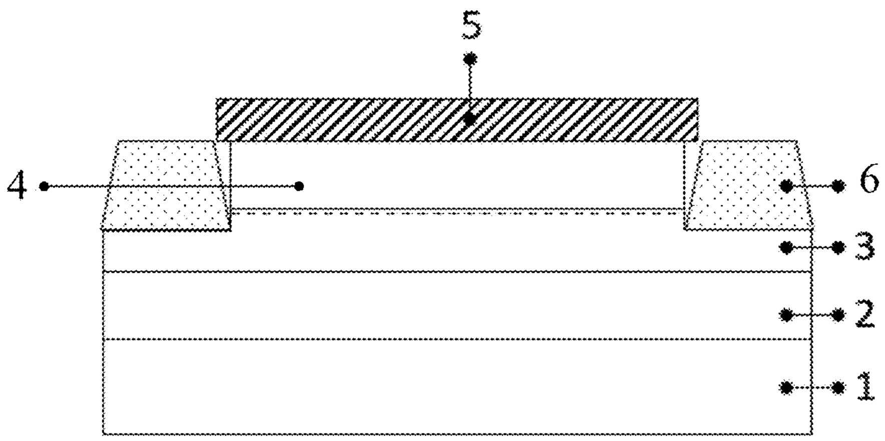
FIG. 1 is a sectional view after the second epitaxial growth of a heavily doped GaN material in the existing art.
Figure 2:
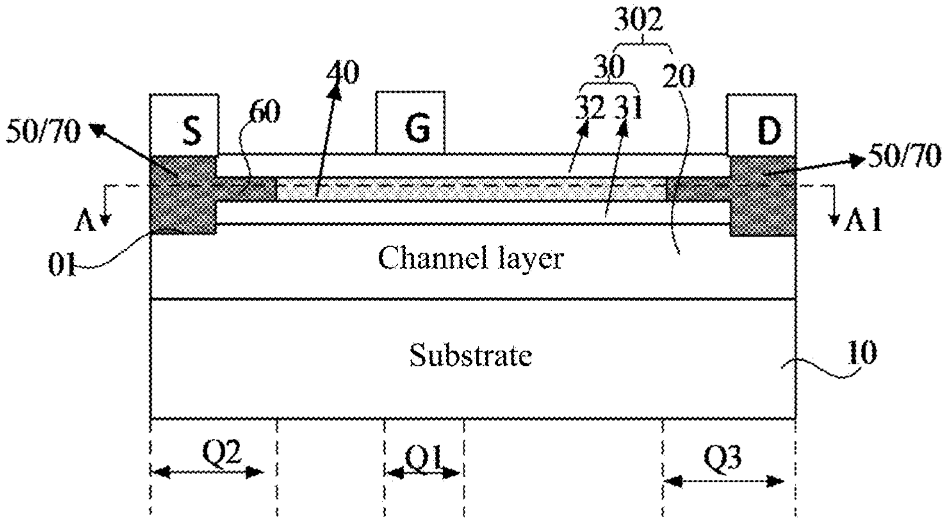
FIG. 2 is a sectional view of a semiconductor structure according to an embodiment of the present invention.

Embodiments of the present invention provide a semiconductor structure. FIG. 2 is a sectional view of a semiconductor structure according to an embodiment of the present invention. Referring to FIG. 2, the semiconductor structure includes a substrate 10, a channel structure 302, a first groove 70, an insertion layer 40, and a heavily doped material layer 50.

The channel structure 302 is located on the substrate 10. The channel structure 302 includes a channel layer 20 and a barrier layer 30 formed on the substrate 10 in sequence. The channel structure 302 includes a gate region Q1, a source region Q2 and a drain region Q3. The source region Q2 and the drain region Q3 are located on two sides of the gate region Q1.

The first groove 70 is located in the source region Q2 and the drain region Q3. The first groove 70 penetrates at least the barrier layer 30.

The insertion layer 40 is disposed in the barrier layer 30. The sidewalls of the insertion layer 40 located at ends of the source region Q2 and the drain region Q3 are recessed by a preset distance relative to sidewalls of the barrier layer 30 to form a recessed trench 60. The recessed trench 60 is in communication with the first groove 70.

The heavily doped material layer 50 fills the first groove 70 and the recessed trench 60.

Optionally, the substrate 10 may be a semiconductor substrate 10. The materials of the substrate 10 may include, but are not limited to Si, SiGe, SiC, gallium arsenide, p-doped Si, n-doped Si, sapphire, semiconductor-on-insulator (such as silicon-on-insulator (SOI)), or other suitable materials of the substrate 10. In some embodiments, the substrate 10 may include, for example, but is not limited to, group III elements, group IV elements, group V elements, or combinations thereof (such as III-V compounds). In other embodiments, the materials of the substrate 10 may include a silicon substrate 10 having <111> orientation. In some embodiments, the substrate 10 may include a buffer layer. The buffer layer may be in contact with the channel structure 302. The buffer layer is configured to reduce the lattice and thermal mismatch between the substrate 10 and the channel structure 302, thereby resolving defects due to a mismatch/difference. The buffer layer may include III-V compounds. The III-V compound may include, but is not limited to, aluminum, gallium, indium, nitrogen, or combinations thereof. Thus, the exemplary materials of the buffer layer may also include, for example, but are not limited to, GaN, AlN, AlGaN, InAlGaN, or combinations thereof.

The channel structure 302 includes a channel layer 20 and a barrier layer 30 formed on the substrate 10 in sequence. The materials of the channel layer 20 may include, but are not limited to nitride or group III-V compounds, such as GaN, AlN, InN, InxAlyGa(1-x-y)N (where, x+y≤1), and AlyGa(1-y)N (where, y≤1). The materials of the barrier layer 30 may include, but are not limited to group III-V nitride semiconductor materials, such as GaN, AlGaN, InN, AlInN, InGaN, AlInGaN, or combinations thereof. The band gap of the material of the channel layer 20 and the band gap of the material of the barrier layer 30 are different, so that the electron affinity of the channel layer 20 and the electron affinity of the barrier layer 30 are different from each other, and a heterojunction is formed between the two. A triangular well potential is generated at the joint interface between the channel layer 20 and the barrier layer 30, so that electrons accumulate in the triangular well, thereby generating a two-dimensional electron gas (2DEG) region adjacent to the heterojunction.

Etching is performed in the source region Q2 and the drain region Q3 of the channel structure 302 to form the first groove 70 in the source region Q2 and the drain region Q3. The first groove 70 penetrates at least the barrier layer 30, so that the bottom surface height of the first groove 70 is less than or equal to the interface height of the heterojunction, that is, the first groove 70 may partially penetrate a trench layer 20 or may completely penetrate the channel layer 20. The bottom surface height of the first groove 70 may be the height of the bottom surface (an etched mesa 01) of the first groove 70 relative to the height of the substrate 10. The interface height of the heterojunction may be the height of the interface of the heterojunction relative to the height of the substrate 10. Thus, it is ensured that the heavily doped material layer 50 located in the first groove 70 may be in contact with the heterojunction. The heavily doped material layer 50 includes, but is not limited to, an n-type heavily doped nitride semiconductor material layer. The n-type doping concentration of the heavily doped material layer 50 is greater than $1E18/cm^3$, so that it is ensured that the heavily doped material layer 50 may have a lower resistance, and the conductivity of the heavily doped material layer 50 is improved.

To reduce the contact resistance between the heavily doped material layer 50 and the channel structure 302, in this embodiment of the present invention, the insertion layer 40 is disposed in the barrier layer 30. The barrier layer 30 includes a first barrier sublayer 31 and a second barrier sublayer 32. The insertion layer 40 is located between the first barrier sublayer 31 and the second barrier sublayer 32. The material of the insertion layer 40 is different from the material of the barrier layer 30. There is an etching selection ratio between the barrier layer 30 and the insertion layer 40. Thus, the insertion layer 40 is laterally etched, so that the sidewalls of the insertion layer 40 are recessed by a preset distance relative to sidewalls of the barrier layer 30 to form the recessed trench 60. The recessed trench 60 is in communication with the first groove 70. When the n-type heavily doped nitride semiconductor material is prepared by secondary epitaxy in the first groove 70 to form the heavily doped material layer 50, the nitride semiconductor material may be prepared in the recessed trench 60 by lateral epitaxy. In this manner, the contact area between the heavily doped material layer 50 and the channel structure 302 may be increased, and the heavily doped material layer 50 after lateral epitaxy has better crystal quality. Moreover, the contact resistance between the heavily doped material layer 50 and the sidewall of the heterojunction is effectively reduced. The material of the insertion layer 40 is a group III nitride material. The material of the insertion layer 40 is a group III nitride material. The material of the barrier layer 30 and the material of the insertion layer 40 are group III nitride materials. The material of the barrier layer 30 is AlGaN. The material of the insertion layer 40 is AlN or GaN. Optionally, when the material of the barrier layer 30 is, for example, AlGaN, the material of the insertion layer 40 may be GaN or AlN. The structure of the barrier layer 30 and the insertion layer 40 forms a sandwich barrier layer structure. The insertion layer 40 is made of a material composed of some of the chemical elements in the barrier layer 30, which may not only satisfy the requirements of selective etching, but also make the lattice constant of the material of the insertion layer 40 and the lattice constant of the material of the barrier layer 30 relatively close, thereby improving the growth quality of the semiconductor structure. Optionally, the projection of the recessed groove 60 on the substrate 10 is located in the source region Q2 and the drain region Q3. The sidewalls of the insertion layer 40 are recessed by the preset distance relative to sidewalls of the barrier layer 30 to form the recessed groove 60. The preset distance is less than one third of the length of the channel structure 302.

The semiconductor structure provided by this embodiment of the present invention includes a substrate 10, a channel structure 302, a first groove 70, an insertion layer 40, and a heavily doped material layer 50. The channel structure 302 is located on the substrate 10. The channel structure 302 includes a channel layer 20 and a barrier layer 30 formed on the substrate 10 in sequence. The channel structure 302 includes a gate region Q1, a source region Q2 and a drain region Q3. The source region Q2 and the drain region Q3 are located on two sides of the gate region Q1. The first groove 70 is located in the source region Q2 and the drain region Q3. The first groove 70 penetrates at least the barrier layer 30. The insertion layer 40 is disposed in the barrier layer 30. The sidewalls of the insertion layer 40 located at ends of the source region Q2 and the drain region Q3 are recessed by the preset distance relative to sidewalls of the barrier layer 30 to form the recessed trench 60. The recessed trench 60 is in communication with the first groove 70. The heavily doped material layer 50 fills the first groove 70 and the recessed trench 60. In this manner, the contact area between the heavily doped material layer 50 and the channel structure 302 may be increased, and the contact resistance between the heavily doped material layer 50 and the sidewall of the heterojunction is reduced.

On the basis of the preceding embodiment, in an embodiment of the present invention, further referring to FIG. 2, the semiconductor structure includes a gate (G), a source(S), and a drain (D). The gate (G) is located in the gate region Q1. The gate (G) is located on the side of the barrier layer 30 facing away from the substrate 10. The source(S) and the drain (D) are located in the source region Q2 and the drain region Q3, respectively. The source(S) and the drain (D) are formed on the side of the heavily doped material layer 50 facing away from the substrate 10.

Optionally, the material of the gate (G) may be metal or a metal compound, including but not limited to wolfram (W), gold (Au), palladium (Pd), titanium (Ti), tantalum (Ta), cobalt (Co), nickel (Ni), platinum (Pt), molybdenum (Mo), titanium nitride (TiN), tantalum nitride (TaN), other metal compounds, nitride, oxide, silicide, a doped semiconductor, metal alloy, or combinations thereof. There may be a layer of a p-doped group III-V nitride semiconductor material, such as p-type GaN, between the gate (G) and the barrier layer 30. The p-doped material may be obtained by using p-type impurities such as Be, Zn, Cd, and Mg. The materials of the source(S) and the drain (D) may include, but are not limited to, metal, alloy, and doped semiconductor materials (such as doped crystalline silicon), for example, compounds of silicide and nitride, other conductor materials, or combinations thereof. The source(S) and drain (D) may be a single layer or multiple layers with the same or different composition. In some embodiments, the source(S) and drain (D) form ohmic contact with the heavily doped material layer 50. Ohmic contact may be implemented by applying Ti, Al, or other suitable materials to the source(S) and the drain (D).

On the basis of the preceding embodiments, in an embodiment of the present invention, further referring to FIG. 2, the heavily doped material layer 50 is a single material layer. The heavily doped material layer 50 is an n-type heavily doped nitride semiconductor material layer. The n-type doping concentration of the heavily doped material layer 50 is greater than 1E18/cm$^3$.

Figure 3:
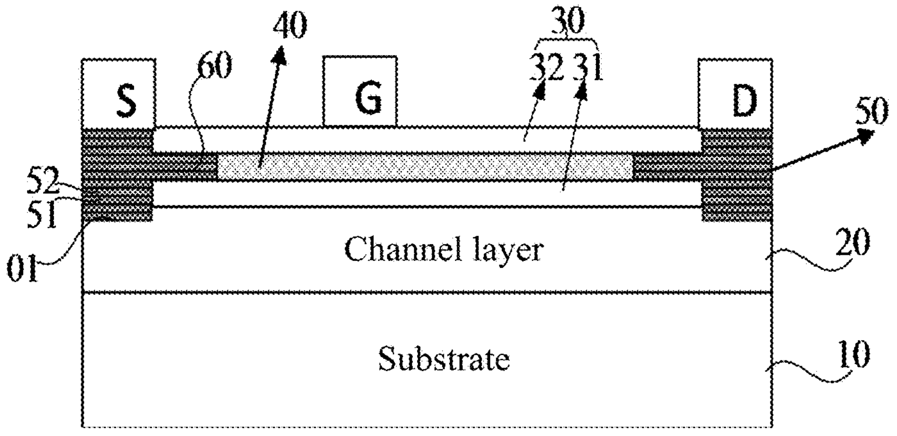
FIG. 3 is a sectional view of another semiconductor structure according to an embodiment of the present invention.

On the basis of the preceding embodiments, in an embodiment of the present invention, FIG. 3 is a sectional view of another semiconductor structure according to an embodiment of the present invention. Referring to FIG. 3, the heavily doped material layer 50 is a laminated material layer. The laminated material layer includes a superlattice structure. Two adjacent material layers (for example, the film 51 and the film 52) have different n-type heavily doped nitride semiconductor materials. The n-type heavy doping concentration is greater than 1E18/cm$^3$. For example, the heavily doped material layer 50 is a superlattice structure in which InGaN layers and GaN layers are alternately stacked in sequence. Alternatively, the heavily doped material layer 50 is a superlattice structure in which AlGaN layers and GaN layers are alternately stacked in sequence. The superlattice structure has relatively high crystal quality, thereby further improving the growth quality of the semiconductor structure.

Figure 4:
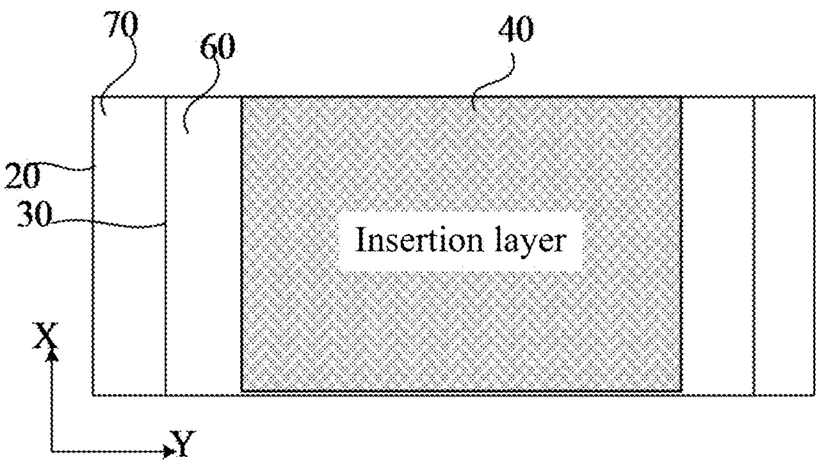
FIG. 4 is a top view of an insertion layer, a barrier layer, and a channel layer according to an embodiment of the present invention.
Figure 5:
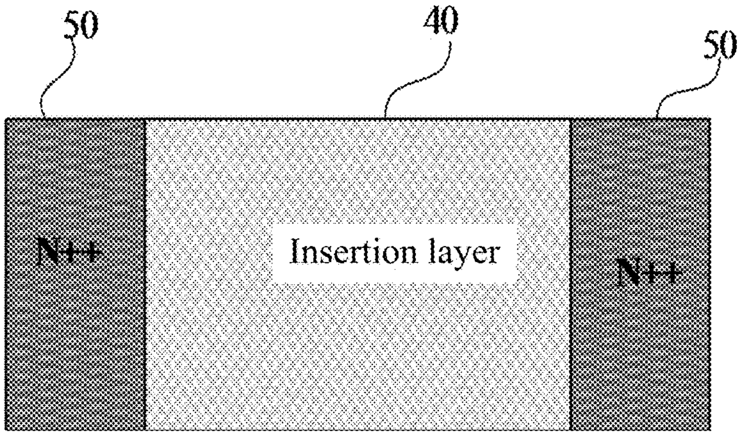
FIG. 5 is a sectional view taken along section line AA1 of FIG. 2 to illustrate the structure of FIG. 2.

On the basis of the preceding embodiments, in an embodiment of the present invention, FIG. 4 is a top view of an insertion layer, a barrier layer, and a channel layer according to an embodiment of the present invention. FIG. 5 is a sectional view taken along section line AA1 of FIG. 2 to illustrate the structure of FIG. 2. Referring to FIGS. 4, 5, and 2, the recessed trench 60 is a trench penetrating in the direction X of the channel width. It is to be understood that the entire sidewall of the insertion layer 40 is etched in the direction X of the channel width of the channel structure to form the recessed trench 60. The sidewall of the heavily doped material layer 50 adjacent to the insertion layer 40 is a plane, so that the bottom surface of the recessed trench 60 is a flat surface, and the vertical projection of a sidewall of the heavily doped material layer 50 facing the insertion layer 40 on the substrate 10 is linear.

Figure 6:
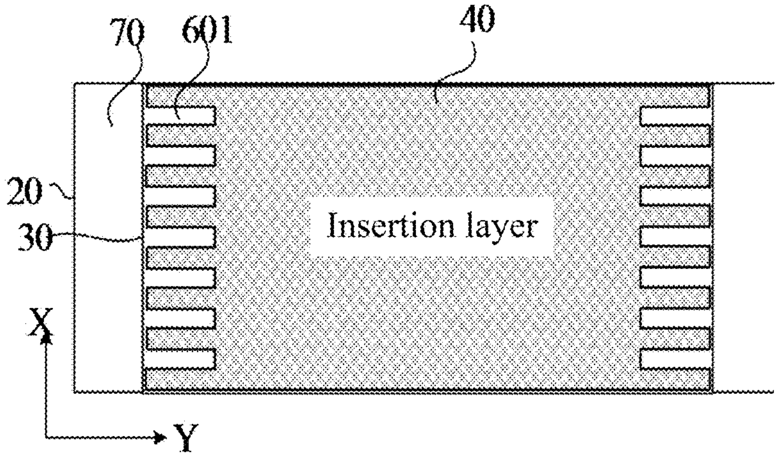
FIG. 6 is a top view of an insertion layer, a barrier layer, and a channel layer according to an embodiment of the present invention.
Figure 7:
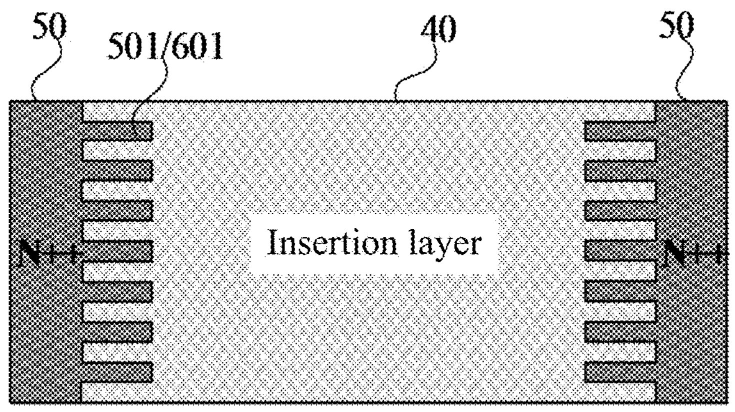
FIG. 7 is another sectional view taken along section line AA1 of FIG. 2 to illustrate the structure of FIG. 2.

On the basis of the preceding embodiments, in an embodiment of the present invention, FIG. 6 is a top view of another insertion layer, another barrier layer, and another channel layer according to an embodiment of the present invention. FIG. 7 is another sectional view taken along section line AA1 of FIG. 2 to illustrate the structure of FIG. 2. Referring to FIGS. 6 and 7, in conjunction with FIG. 2, the recessed trench 60 includes at least one finger-shaped trench 601. The at least one finger-shaped trench 601 is arranged at intervals in the direction X of the channel width of the channel structure 302. The sidewall of the heavily doped material layer 50 adjacent to the insertion layer 40 includes at least one protrusion 501. The protrusion 501 is embedded in the finger-shaped trench 601 in one-to-one correspondence. It is to be understood that when the sidewall of the insertion layer 40 is etched, the sidewalls of partial positions are selectively etched to form a first sub-trench 601. The recessed trench 60 is configured to be multiple finger-shaped trenches 601. In this manner, the contact area between the heavily doped material layer 50 and the channel structure 302 may be further increased, and the contact resistance between the heavily doped material layer 50 and the sidewall of the heterojunction is reduced. The recessed trench 60 may include multiple rectangular finger-shaped trenches 601. The vertical projection of a sidewall of the heavily doped material layer 50 facing the insertion layer 40 on the substrate 10 is comb-shaped. In this embodiment, the distance between a finger-shaped trench 601 and the side of the recessed trench 60 adjacent to the first groove 70 is equal to 0.

Figure 8:
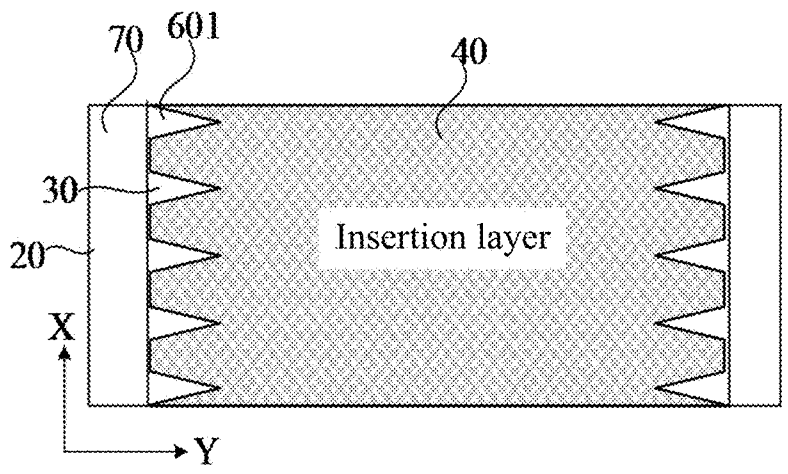
FIG. 8 is a top view of another insertion layer, another barrier layer, and another channel layer according to an embodiment of the present invention.
Figure 9:
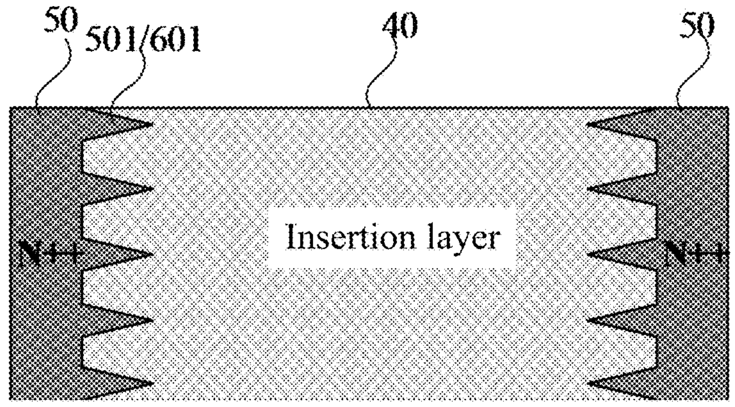
FIG. 9 is another sectional view taken along section line AA1 of FIG. 2 to illustrate the structure of FIG. 2.

On the basis of the preceding embodiments, FIG. 8 is a top view of another insertion layer, another barrier layer, and another channel layer according to an embodiment of the present invention. FIG. 9 is another sectional view taken along section line AA1 of FIG. 2 to illustrate the structure of FIG. 2. Referring to FIGS. 8 and 9, the difference between the recessed trench 60 provided by this embodiment of the present invention and the recessed trench 60 shown in FIG. 6 and FIG. 7 is that the recessed trench 60 provided by this embodiment of the present invention includes multiple triangular finger-shaped trenches 601, and the vertical projection of a sidewall of the heavily doped material layer 50 facing the insertion layer 40 on the substrate 10 is serrated.

Figure 10:
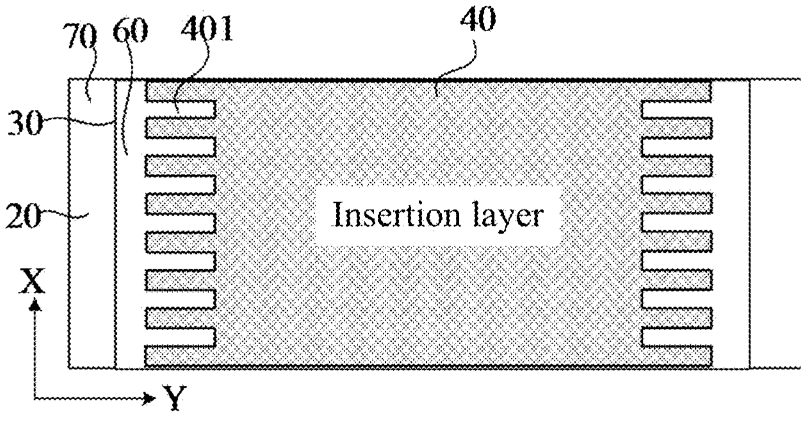
FIG. 10 is a top view of another insertion layer, another barrier layer, and another channel layer according to an embodiment of the present invention.
Figure 11:
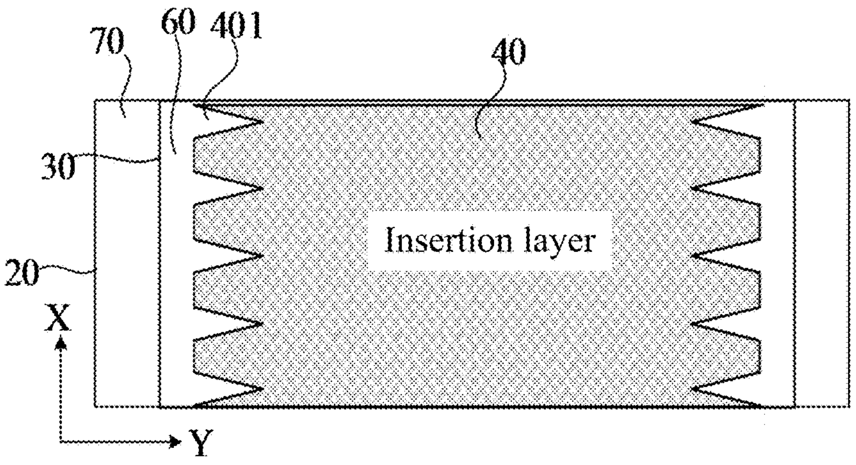
FIG. 11 is a top view of another insertion layer, another barrier layer, and another channel layer according to an embodiment of the present invention.

On the basis of the preceding embodiments, in an embodiment of the present invention, FIG. 10 is a top view of another insertion layer, another barrier layer, and another channel layer according to an embodiment of the present invention. FIG. 11 is a top view of another insertion layer, another barrier layer, and another channel layer according to an embodiment of the present invention. Referring to FIGS. 10 and 11, the distance between the finger-shaped trench 601 and the side of the recessed trench 60 adjacent to the first groove 70 is greater than 0. The at least one finger-shaped trench 401 is arranged at intervals in the direction X of the channel width of the channel structure 302. The sidewall of the heavily doped material layer 50 adjacent to the insertion layer 40 includes at least one protrusion 501. The protrusion 501 is embedded in the finger-shaped trench 401 in one-to-one correspondence.

It is to be understood that after the entire sidewall of the insertion layer 40 is etched to form the recessed trench 60, and then the bottom of the recessed trench 60 is selectively etched in the direction X of the channel width to form a finger-shaped trench 401; or when the sidewall of the insertion layer 40 is etched to form the recessed trench 60, the etching speed and/or etching duration at different positions is adjusted, so that the recessed trench 60 and the finger-shaped trench 401 are simultaneously formed. For example, when the sidewall of the insertion layer 40 is etched, the etching time at the position with the finger-shaped trench 401 may be extended, and the etching time at the position without the finger-shaped trench 401 may be shortened. At least one finger-shaped trench 401 communicating with the recessed trench 60 is formed on the sidewall of the insertion layer 40 adjacent to the heavily doped material layer 50. In this manner, the contact area between the heavily doped material layer 50 and the channel structure 302 may be further increased, and the contact resistance between the heavily doped material layer 50 and the sidewall of the heterojunction is reduced. Optionally, when the finger-shaped trench 401 is rectangular shown in FIG. 10, the vertical projection of a sidewall of the heavily doped material layer 50 facing the insertion layer 40 on the substrate 10 is comb-shaped (referring to FIG. 7). When the finger-shaped trench 401 is triangular shown in FIG. 11, the vertical projection of a sidewall of the heavily doped material layer 50 facing the insertion layer 40 on the substrate 10 is serrated (referring to FIG. 9).

In summary, the distance between the at least one finger-shaped trench 601 and the side of the recessed trench 60 adjacent to the first groove 70 is ≥0.

Figure 12A:
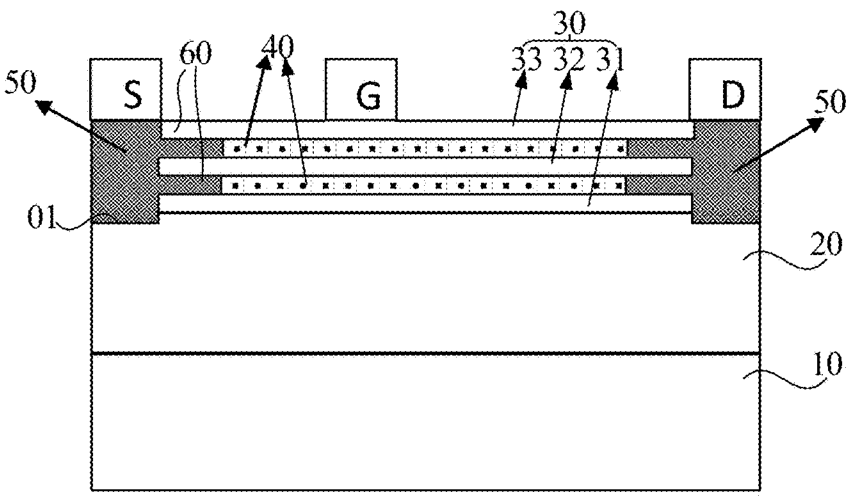
FIG. 12*a* is a sectional view of another semiconductor structure according to an embodiment of the present invention.

On the basis of the preceding embodiments, in an embodiment of the present invention, FIG. 12*a* is a sectional view of another semiconductor structure according to an embodiment of the present invention. Referring to FIG. 12*a*, multiple insertion layers 40 are disposed in the barrier layer 30.

In the direction perpendicular to the substrate 10, the multiple insertion layers 40 are disposed at intervals in sequence.

Figure 12B:
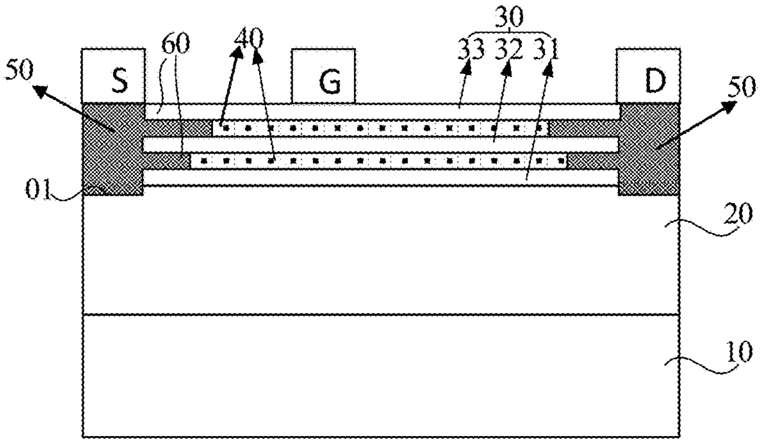
FIG. 12*b* is a sectional view of another semiconductor structure according to an embodiment of the present invention.
Figure 12C:
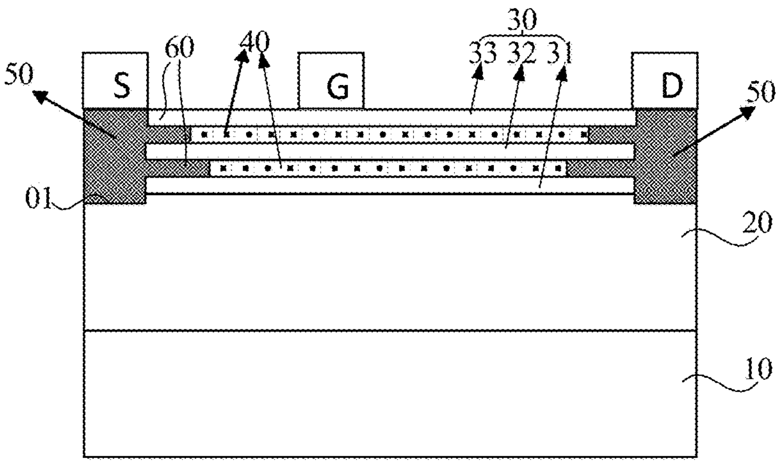
FIG. 12*c* is a sectional view of another semiconductor structure according to an embodiment of the present invention.

Optionally, the sidewalls of each insertion layer 40 adjacent to the source region and the sidewalls of each insertion layer 40 adjacent to the drain region are recessed by a preset distance relative to sidewalls of the barrier layer 30 to form multiple recessed trenches 60. Each recessed trench 60 is in communication with the first groove 70. The figure exemplarily shows that two insertion layers 40 are disposed in the barrier layer 30. Each insertion layer 40 forms a recessed trench 60 adjacent to the source region and a recessed trench 60 adjacent to the drain region respectively, so that four recessed trenches 60 may be formed. Multiple insertion layers 40 are disposed in the barrier layer 30. In this manner, the contact area between the heavily doped material layer 50 and the channel structure 302 may be further increased, and the contact resistance between the heavily doped material layer 50 and the sidewall of the heterojunction is reduced. In an optional embodiment, in the direction where the substrate 10 points to the channel layer 20, lengths of multiple insertion layers 40 are identical, or sequentially decrease, or sequentially increase. The length direction of the insertion layer 40 is parallel to the channel length direction of the channel structure 302. Optionally, referring to FIG. 12*b*, FIG. 12*b* is a sectional view of another semiconductor structure according to an embodiment of the present invention. In the direction where the substrate 10 points to the channel layer 20, lengths of multiple insertion layers 40 sequentially decrease. Referring to FIG. 12*c*, FIG. 12*c* is a sectional view of another semiconductor structure according to an embodiment of the present invention. In the direction where the substrate 10 points to the channel layer 20, lengths of multiple insertion layers 40 sequentially increase.

Figure 13:
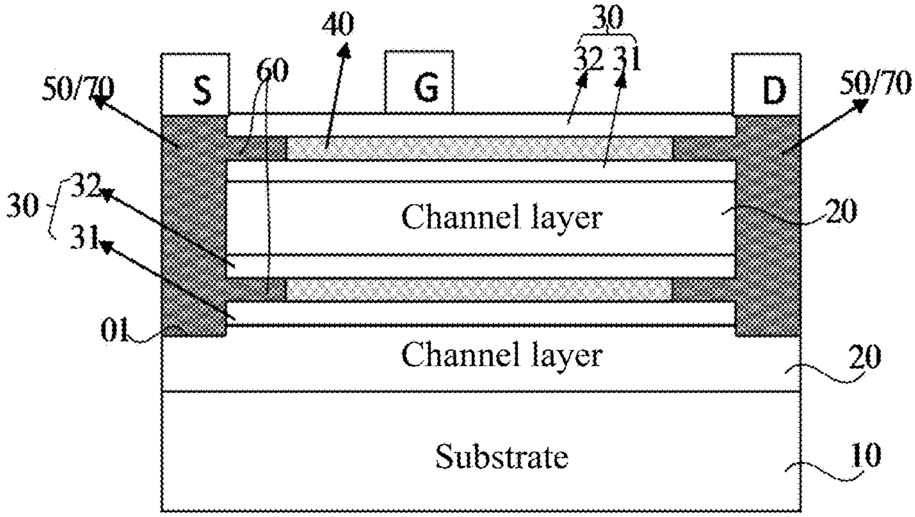
FIG. 13 is a sectional view of another semiconductor structure according to an embodiment of the present invention.

On the basis of the preceding embodiments, in an embodiment of the present invention, FIG. 13 is a sectional view of another semiconductor structure according to an embodiment of the present invention. Referring to FIG. 13, the channel structure 302 includes multiple channel structures 302. The multiple channel structures 302 are stacked on a side of the substrate 10 in sequence. Each layer of multiple insertion layers 40 corresponding to the multiple channel structures 302 includes a recessed trench 60. The first groove 70 penetrates at least the barrier layer 30 adjacent to a side of the substrate 10. Optionally, the present invention adopts a multi-channel AlGaN/GaN heterojunction laminated structure, so that multiple two-dimensional electron gas paths connected in parallel can be formed between a source and a drain. In this manner, the total density of two-dimensional electron gas is improved, so that the saturation current of the device greatly increases.

Figure 14:
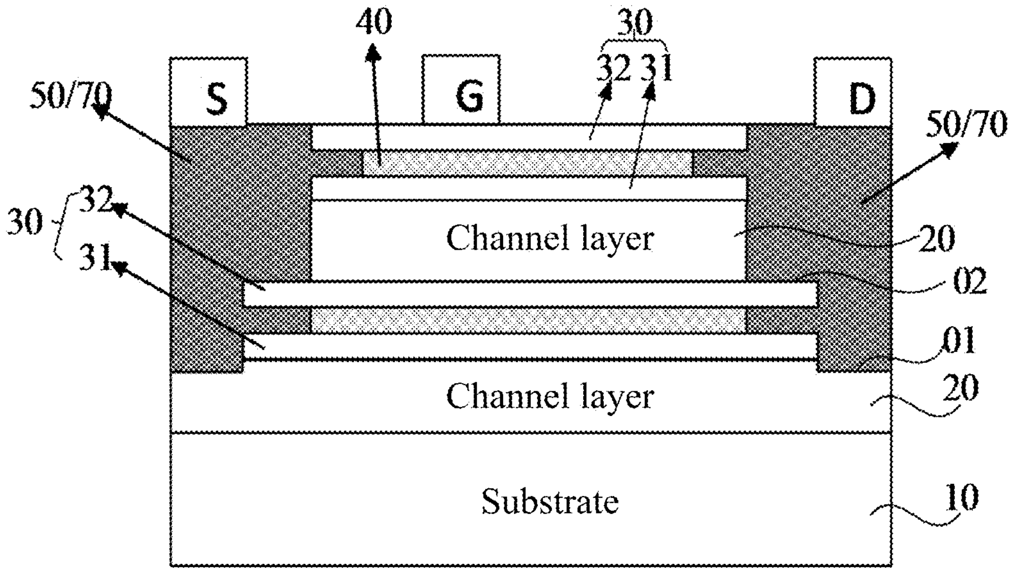
FIG. 14 is a sectional view of another semiconductor structure according to an embodiment of the present invention.
Figure 15:
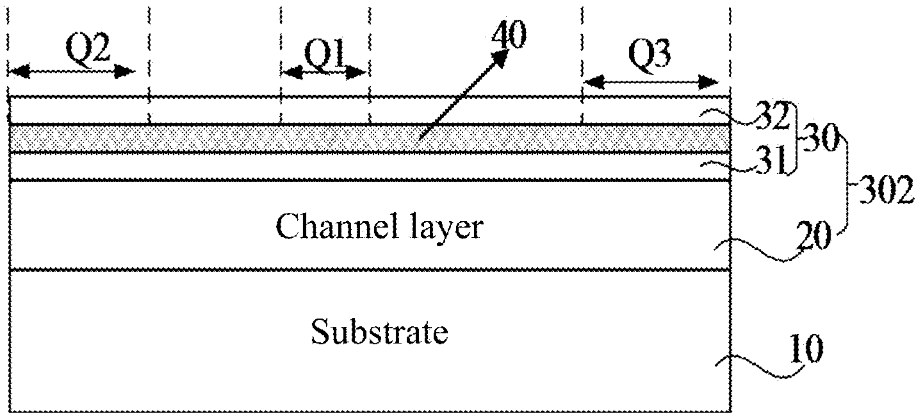
FIGS. 15 to 18 are sectional views of steps S110 to S150 in a manufacturing method of a semiconductor structure according to an embodiment of the present invention.

Optionally, referring to FIG. 14, in the direction where the substrate 10 points to the channel layer 20, lengths of multiple channel structures 302 sequentially decrease.

Optionally, according to the structure shown in FIG. 13, if the lengths of the multiple channel structures 302 are equal, the bottom surface of the first groove 70 formed by etching the multiple channel structures 302 includes an etching mesa 01. In this embodiment of the present invention, in the direction where the substrate 10 points to the channel layer 20, lengths of multiple channel structures 302 sequentially decrease, and there may be multiple mesas. When a multi-channel laminated heterojunction has k layers, the upper surface of each barrier layer 30 except the top barrier layer 30 may have a corresponding etching mesa, and the etching mesa 01 disposed inside the first channel layer 20 is added, that is, k etching mesas. Alternatively, corresponding mesas may be disposed on the upper surfaces of (m−1) barrier layers 30 (excluding the top barrier layer 30) among k barrier layers 30, that is, the total number of etching mesas is m, where $2 \leq m \leq k$. In this manner, there are multiple steps in the sidewall of the multilayer heterojunction laminated structure, and the n-type heavily doped GaN material is formed on m mesas and wraps the sidewalls of k GaN layers and the sidewall of the heterojunction of the barrier layer 30. Since the sidewall has multiple step mesas, the n-type heavily doped GaN material is in closer contact with the sidewall of the heterojunction, thereby reducing the contact resistance between the n-type heavily doped GaN material and the sidewall of a multilayer GaN heterojunction. FIG. 14 illustrates two channel structures, that is, the multi-channel laminated heterojunction has two layers. The etching mesa includes an etching mesa 01 and an etching mesa 02.

Embodiments of the present invention also provide a manufacturing method of a semiconductor structure. FIGS. 15 to 18 are sectional views of steps S110 to S150 in a manufacturing method of a semiconductor structure according to an embodiment of the present invention. Referring to FIGS. 15 to 18, the manufacturing method of a semiconductor structure includes the steps below.

In S110, the substrate 10 is provided.

In S120, the channel structure 302 is formed on a side of the substrate 10. The formation of the channel structure 302 includes forming the channel layer 20 and the barrier layer 30 on the substrate 10 in sequence. The channel structure 302 includes a gate region Q1. a source region Q2 and a drain region Q3. The source region Q2 and the drain region Q3 are located on two sides of the gate region Q1. The formation of the barrier layer 30 includes the formation of the insertion layer 40 in the barrier layer 30. For details, reference may be made to FIG. 15.

Optionally, the barrier layer 30 is formed on the surface of the side of the channel layer 20 facing away from the substrate 10, and the insertion layer 40 is formed on the barrier layer 30 in the following manners. The first barrier sublayer 31 is formed on the surface of the side of the channel layer 20 facing away from the substrate 10. The insertion layer 40 is formed on the surface of the side of the first barrier sublayer 31 facing away from the substrate 10. The second barrier sublayer 32 is formed on the surface of the side of the insertion layer 40 facing away from the substrate 10. The barrier layer 30 includes a first barrier sublayer 31 and a second barrier sublayer 32.

In S130, the channel structure 302 is etched to form the first groove 70. The first groove 70 penetrates at least the barrier layer 30.

Figure 16:
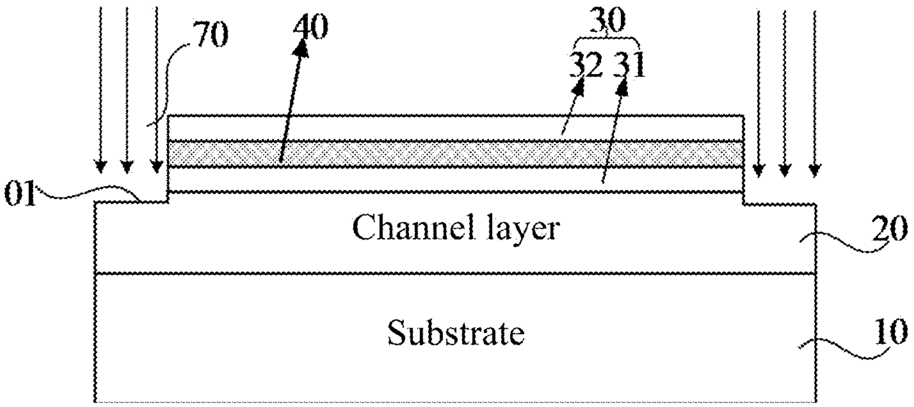

Optionally, referring to FIG. 16, the channel structure 302 is etched to the barrier layer 30 or to the barrier layer 30 of a partial thickness to form the first groove 70, so that the bottom surface height of the first groove 70 is less than or equal to the interface height of the heterojunction, that is, the first groove 70 may partially penetrate the trench layer 20 or may completely penetrate the channel layer 20. The bottom surface height of the first groove 70 may be the height of the bottom surface of the first groove 70 relative to the height of the substrate 10. The interface height of the heterojunction may be the height of the interface of the heterojunction relative to the height of the substrate 10. Thus, it is ensured that the heavily doped material layer 50 located in the first groove 70 may be in contact with the heterojunction.

In S140, the sidewall of the insertion layer 40 is laterally etched. Thus, the sidewalls of the insertion layer 40 located at ends of the source region Q2 and the drain region Q3 are recessed by the preset distance relative to sidewalls of the barrier layer 30 to form the recessed trench 60. The recessed trench 60 is in communication with the first groove 70.

Figure 17:
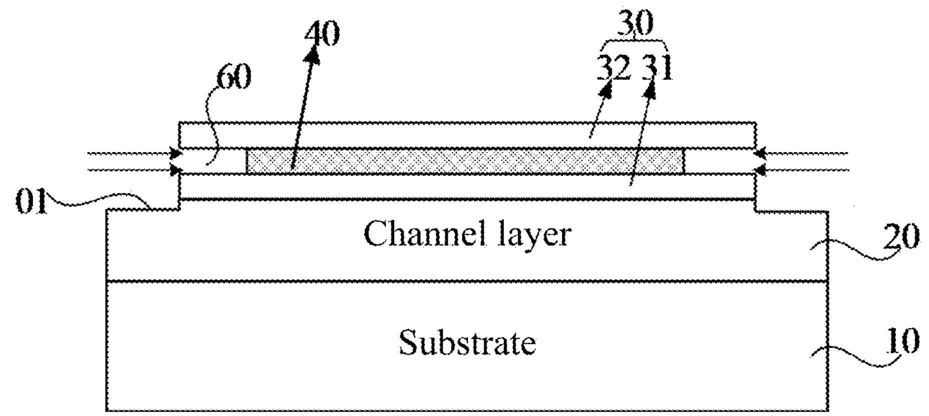

Optionally, referring to FIG. 17, to reduce the contact resistance between the heavily doped material layer 50 and the channel structure 302, in this embodiment of the present invention, the insertion layer 40 is disposed in the barrier layer 30, and the material of the insertion layer 40 is different from the material of the barrier layer 30. Thus, the insertion layer 40 is laterally etched, so that the sidewalls of the insertion layer 40 are recessed by a preset distance relative to sidewalls of the barrier layer 30, and the recessed trench 60 is formed at the insertion layer 40 of the channel structure 302. The recessed trench 60 is in communication with the first groove 70.

In S150, the heavily doped material layer 50 is formed in the first groove 70. The heavily doped material layer 50 fills the first groove 70 and the recessed trench 60.

Figure 18:
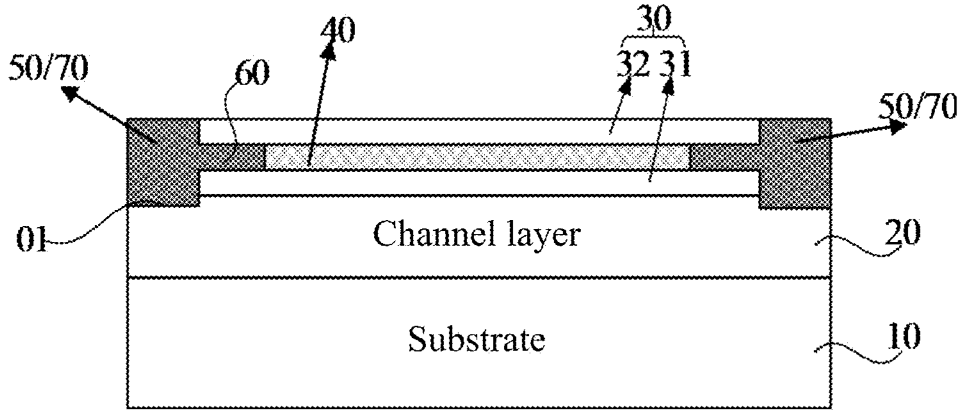
Figure 19:
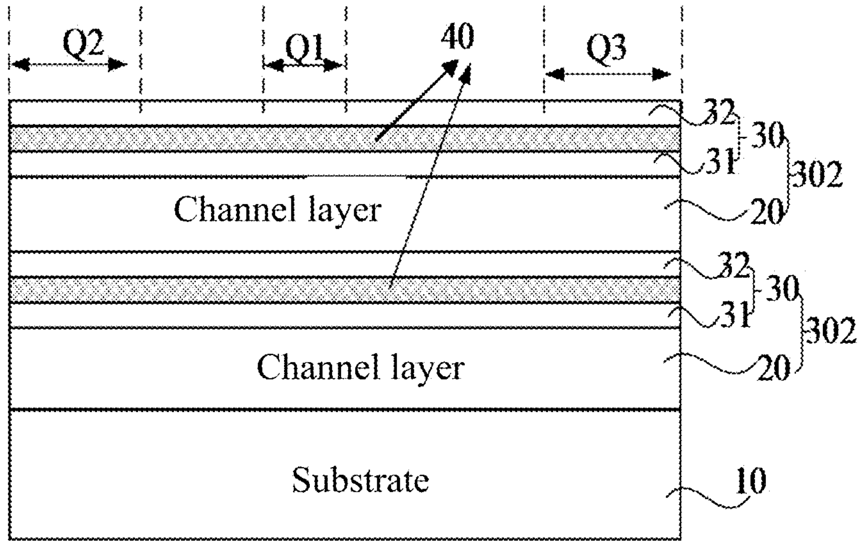
FIGS. 19 to 22 are sectional views of steps S210 to S250 in a manufacturing method of a semiconductor structure according to an embodiment of the present invention.
Figure 20:
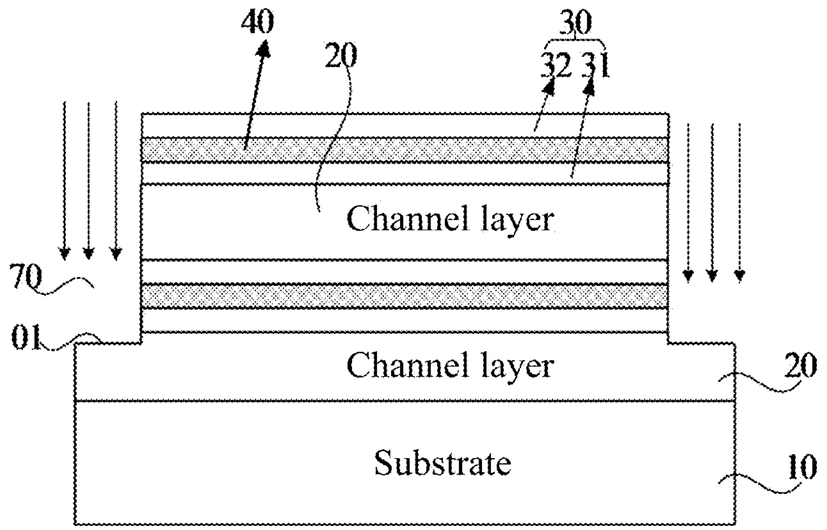
Figure 21:
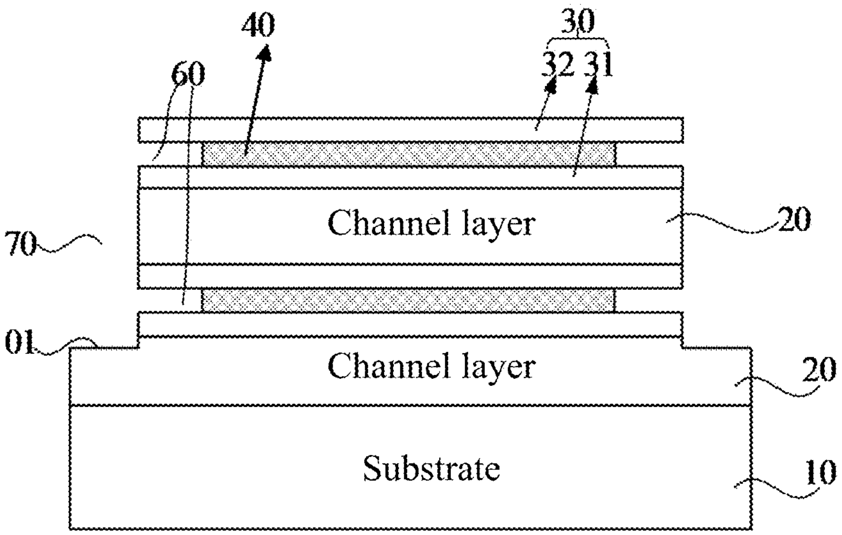
Figure 22:
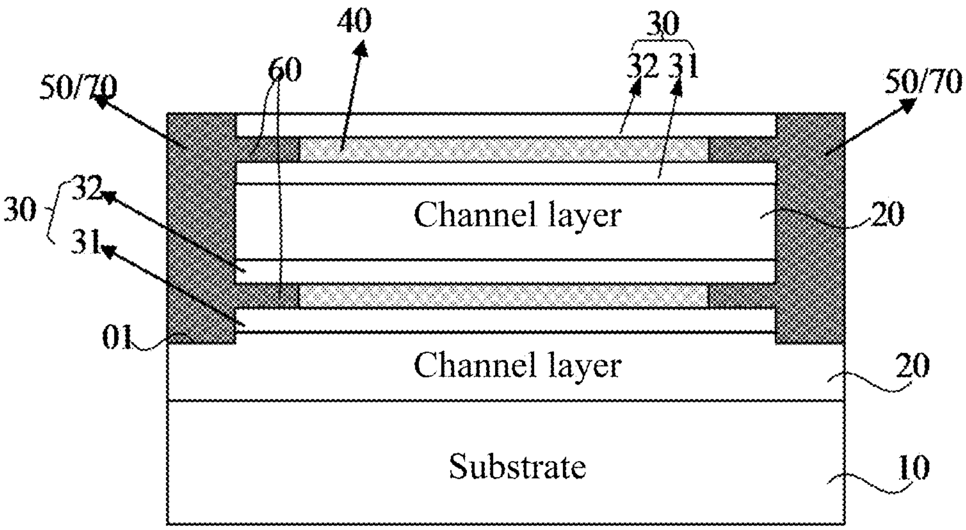

Optionally, referring to FIG. 18, when the n-type heavily doped nitride semiconductor material is deposited in the first groove 70 to form the heavily doped material layer 50, the nitride semiconductor material may be filled in the recessed trench 60. In this manner, the contact area between the heavily doped material layer 50 and the channel structure 302 may be increased, and the contact resistance between the heavily doped material layer 50 and the sidewall of the heterojunction is reduced.

Optionally, after the heavily doped material layer 50 is formed in the first groove 70, the method also includes the step below.

In S160, the gate (G) is formed on the barrier layer 30. The source(S) and the drain (D) are formed on the heavily doped material layer 50. The source(S) and the drain (D) are located on opposite sides of the gate (G). For details, reference may be made to FIG. 2.

In the technical solutions provided by the embodiments of the present invention, the insertion layer 40 is disposed in the barrier layer 30. After the channel structure 302 is etched to form at least the first groove 70 that penetrates the barrier layer 30, the sidewall of the insertion layer 40 is laterally etched. Thus, the sidewalls of the insertion layer 40 located at ends of the source region Q2 and the drain region Q3 are recessed by the preset distance relative to sidewalls of the barrier layer 30 to form the recessed trench 60. The recessed trench 60 is configured to be in communication with the first groove 70. When the heavily doped material layer 50 is formed in the first groove 70, the heavily doped material layer 50 may be filled in the first groove 70 and may also be filled in the recessed trench 60. In this manner, the contact area between the heavily doped material layer 50 and the channel structure 302 may be increased, and the contact resistance between the heavily doped material layer 50 and the heterojunction sidewall is reduced.

Optionally, the sidewall of the insertion layer 40 is laterally etched to form the recessed trench 60 in the following manners. The sidewall of the insertion layer 40 is laterally etched selectively. At least one finger-shaped trench 601 is formed in the insertion layer 40 located at ends of the source region Q2 and the drain region Q3. The at least one finger-shaped trench 601 is arranged at intervals in the direction of the channel width of the channel structure 302. The recessed trench 60 includes at least one finger-shaped trench 601. In the preceding manufacturing method of the recessed trench 60, the recessed trench 60 may be formed to include multiple finger-shaped trenches 601 shown in FIG. 6 or 8. Referring to FIG. 7 or 9, when the heavily doped material layer 50 is formed in the first groove 70, the method also includes the following manner. The heavily doped material layer 50 is laterally grown, so that the heavily doped material layer 50 fills at least one finger-shaped trench 601 to form the protrusion 501.

Optionally, after the sidewall of the insertion layer 40 is laterally etched selectively to form the recessed trench 60 shown in FIG. 4, the method also includes the following manner. The sidewall of the insertion layer 40 is continuously etched laterally to form at least one finger-shaped trench 401. Referring to FIGS. 10 and 11, at least one finger-shaped trench 401 is arranged at intervals in the direction of the channel width of the channel structure 302. When the heavily doped material layer 50 is formed in the first groove 70, the method also includes the following manner. The heavily doped material layer 50 is laterally grown, so that the heavily doped material layer 50 fills the recessed trench 60 and at least one finger-shaped trench 401 to form the protrusion 501 in the at least one finger-shaped trench 401.

Optionally, the heavily doped material layer 50 is formed in the first groove 70 in the manners below.

The heavily doped material layer 50 of the single-layer material layer or the heavily doped material layer 50 of the laminated material layer is formed in the first groove 70. When the heavily doped material layer 50 is formed, n-type doping is performed on the heavily doped material layer 50. The doping concentration is greater than $1E18/cm^3$.

Optionally, the insertion layer 40 is formed on the barrier layer 30 in the following manners. Multiple insertion layers 40 are disposed in the barrier layer 30. In the direction perpendicular to the substrate 10, the multiple insertion layers 40 are disposed at intervals in sequence. Thus, the semiconductor structure as shown in FIG. 12*a* may be formed.

Embodiments of the present invention also provide another manufacturing method of a semiconductor structure. FIGS. 19 to 22 are sectional views of steps S210 to S250 in a manufacturing method of a semiconductor structure according to an embodiment of the present invention. Referring to FIGS. 19 to 22, the manufacturing method of a semiconductor structure includes the steps below.

In S210, the substrate 10 is provided.

In S220, multiple channel structures 302 are formed on the side of the substrate 10. The multiple channel structures 302 are stacked on the side of the substrate 10 in sequence. Optionally, referring to FIG. 19, multiple channel structures 302 are formed on the side of the substrate 10. The formation of the channel structure 302 includes forming the channel layer 20 and the barrier layer 30 on the substrate 10 in sequence. The channel structure 302 includes a gate region Q1, a source region Q2 and a drain region Q3. The source region Q2 and the drain region Q3 are located on two sides of the gate region Q1. The formation of the barrier layer 30 includes the formation of the insertion layer 40 in the barrier layer 30.

In S230, the multiple channel structures 302 are etched to form the first groove 70 that penetrates at least the barrier layer 30 adjacent to a side of the substrate 10. For details, reference may be made to FIG. 20.

In S240, the sidewall of the insertion layer 40 is laterally etched selectively. Thus, the sidewalls of the insertion layer 40 located at ends of the source region Q2 and the drain region Q3 are recessed by the preset distance relative to sidewalls of the barrier layer 30 to form the recessed trench 60. The recessed trench 60 is in communication with the first groove 70. Optionally, referring to FIG. 21, the sidewalls of the insertion layers 40 located in different layers may be etched at the same time, or the sidewalls of the insertion layers 40 located in different layers may be etched at different times.

In S250, the heavily doped material layer 50 is formed in the first groove 70. The heavily doped material layer 50 fills the first groove 70 and the recessed trench 60. For details, reference may be made to FIG. 22.

In S260, the gate (G) is formed on the barrier layer 30 farthest from the substrate 10. The source(S) and the drain (D) are formed on the heavily doped material layer 50. The source(S) and the drain (D) are located on opposite sides of the gate (G). For details, reference may be made to FIG. 13.

In the manufacturing method of a semiconductor structure provided by the embodiments of the present invention, multiple channel structures 302 are formed on the side of the substrate 10. The multiple channel structures 302 are stacked on the side of the substrate 10 in sequence. The multiple channel structures 302 are etched to form the first groove 70 that penetrates at least the barrier layer 30 adjacent to a side of the substrate 10. The present invention adopts the multi-channel AlGaN/GaN heterojunction laminated structure, so that multiple two-dimensional electron gas paths connected in parallel can be formed between a source and a drain. In this manner, the total density of the two-dimensional electron gas is improved, so that the saturation current of the device greatly increases.

Figure 23:
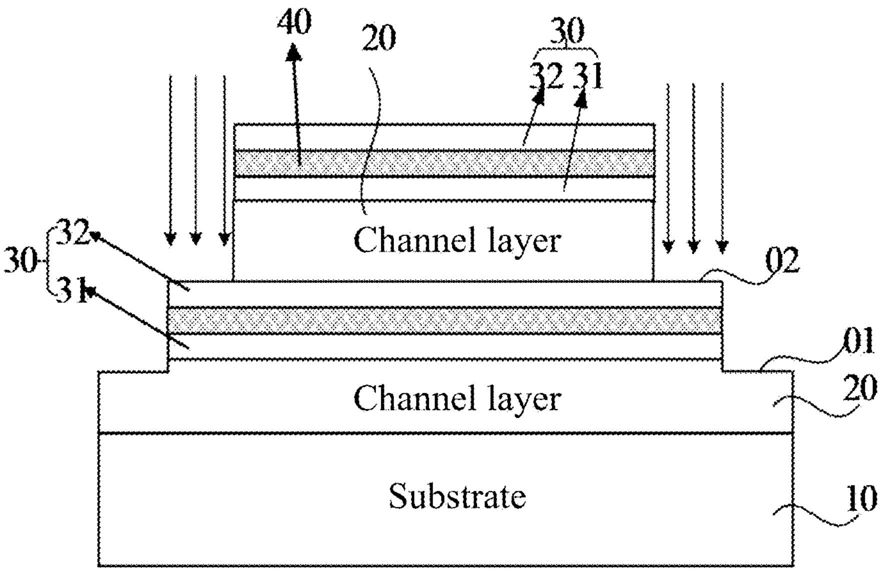
FIGS. 23 to 24 are sectional views of partial steps in a manufacturing method of a semiconductor structure shown in FIG. 14 according to an embodiment of the present invention.
Figure 24:
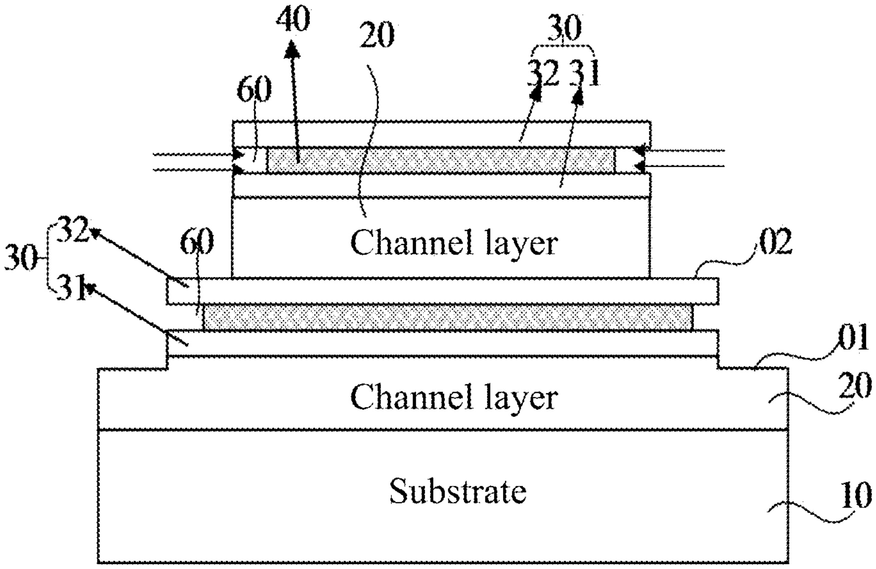

Optionally, referring to FIG. 14, in the direction where the substrate 10 points to the channel layer 20, the lengths of multiple channel structures 302 sequentially decrease. FIGS. 23 to 24 are sectional views of partial steps in a manufacturing method of a semiconductor structure shown in FIG. 14 according to an embodiment of the present invention. Referring to FIGS. 23 and 24, during the process of etching the multiple channel structures 302, in the direction in which the gate points to the substrate 10, the barrier layer 30, the insertion layer 40, and the channel layer 20 are etched multiple times from deep to shallow to form multiple etching mesas at different heights (such as the etching mesa 01 and the etching mesa 02). Different etching mesas are located below the interface of the heterojunction formed by the channel layer 20 and the interface of the heterojunction formed by the barrier layer 30 of different layers, respectively.

In this manner, there are multiple steps in the sidewall of the multilayer heterojunction laminated structure. The n-type heavily doped GaN material is formed on multiple mesas and wraps the sidewalls of multiple channel layers 20 and the sidewall of the heterojunction of the barrier layer 30. Since the sidewall has multiple step mesas, the n-type heavily doped GaN material is in closer contact with the sidewall of the heterojunction, thereby reducing the contact resistance between the n-type heavily doped GaN material and the sidewall of a multilayer GaN heterojunction.

Referring to FIG. 14, optionally, in the direction where the substrate 10 points to the trench layer 20, the lengths of multiple recessed trenches 60 corresponding to multiple insertion layers 40 of multiple channel structures 302 sequentially decrease. Optionally, in the direction where the substrate 10 points to the trench layer 20, the projections of the multiple recessed trench 60 on the substrate 10 corresponding to the multiple insertion layers 40 of the multiple channel structures 302 do not overlap each other.

In this embodiment, referring to FIG. 13, the sidewall of the first groove 70 adjacent to the multiple channel structures 302 is a vertical surface. Referring to FIG. 14, the sidewall of the first groove 70 adjacent to the multiple channel structures 302 is step-shaped. In other embodiments, the lengths of multiple channel structures 302 sequentially decrease. The sidewall of the first groove 70 adjacent to the multiple channel structures 302 is an inclined surface.

In the technical solutions provided by the embodiments of the present invention, the insertion layer is disposed in the barrier layer. After the channel structure is etched to form at least the first groove that penetrates the barrier layer, the sidewall of the insertion layer is laterally etched. Thus, the sidewalls of the insertion layer located at ends of the source region and the drain region are recessed by the preset distance relative to the sidewalls of the barrier layer to form the recessed trench. The recessed trench is configured to be in communication with the first groove. When the heavily doped material layer is formed in the first groove, the heavily doped material layer may be filled in the first groove and may also be filled in the recessed trench. In this manner, the contact area between the heavily doped material layer and the channel structure may be increased, and the contact resistance between the heavily doped material layer and the sidewall of the heterojunction is reduced.

What is claimed is:

1. A semiconductor structure, comprising:

a substrate;

a channel structure located on the substrate, wherein the channel structure comprises a channel layer and a barrier layer formed on the substrate in sequence, and the channel structure comprises a gate region, a source region and a drain region, wherein the source region and the drain region are located on two sides of the gate region;

a first groove located in the source region and the drain region, wherein the first groove penetrates at least the barrier layer;

an insertion layer disposed in the barrier layer, wherein sidewalls of the insertion layer located at ends of the source region and the drain region are recessed by a preset distance relative to sidewalls of the barrier layer to form a recessed trench, and the recessed trench is in communication with the first groove; and a heavily doped material layer filling the first groove and the recessed trench.

2. The semiconductor structure according to claim 1, further comprising:

a gate located in the gate region, wherein the gate is located on a side of the barrier layer facing away from the substrate; and a source and a drain that are located in the source region and the drain region respectively, wherein the source and the drain are formed on a side of the heavily doped material layer facing away from the substrate.

3. The semiconductor structure according to claim 1, wherein the heavily doped material layer is a single material layer, or a laminated material layer comprising a superlattice structure.

4. The semiconductor structure according to claim 1, wherein a material of the barrier layer and a material of the insertion layer are group III nitride materials, wherein the material of the barrier layer is AlGaN, and the material of the insertion layer is AlN or GaN.

5. The semiconductor structure according to claim 1, wherein a sidewall of the heavily doped material layer adjacent to the insertion layer comprises at least one protrusion; the recessed trench comprises at least one finger-shaped trench arranged at intervals in a direction of a channel width of the channel structure; and the at least one protrusion is embedded in the at least one finger-shaped trench in one-to-one correspondence.

6. The semiconductor structure according to claim 5, wherein a vertical projection of a sidewall of the heavily doped material layer facing the insertion layer on the substrate is serrated or comb-shaped.

7. The semiconductor structure according to claim 5, wherein a distance between the at least one finger-shaped trench and a side of the recessed trench adjacent to the first groove is not less than 0.

8. The semiconductor structure according to claim 1, wherein a plurality of insertion layers are disposed in the barrier layer; and in a direction perpendicular to the substrate, the plurality of insertion layers are disposed at intervals in sequence.

9. The semiconductor structure according to claim 1, comprising:

a plurality of channel structures stacked on a side of the substrate in sequence, wherein the insertion layer of each of the plurality of channel structures comprises a recessed trench.

10. The semiconductor structure according to claim 9, wherein the first groove penetrates at least a barrier layer of a channel structure of the plurality of channel structures adjacent to a side of the substrate.

11. The semiconductor structure according to claim 9, wherein in a direction where the substrate points to the channel layer of each of the channel structures, lengths of the plurality of channel structures sequentially decrease.

12. The semiconductor structure according to claim 9, wherein in a direction where the substrate points to the channel layer of each of the channel structures, lengths of the plurality of insertion layers are identical, or sequentially decrease, or sequentially increase.

13. A manufacturing method of a semiconductor structure, comprising:

providing a substrate;

forming a channel structure on a side of the substrate; wherein forming the channel structure comprises forming a channel layer and a barrier layer on the substrate in sequence, and the channel structure comprises a gate region, a source region and a drain region, wherein the source region and the drain region are located on two sides of the gate region; wherein forming the barrier layer comprises forming an insertion layer in the barrier layer;

etching the channel structure to form a first groove, wherein the first groove penetrates at least the barrier layer;

laterally etching a sidewall of the insertion layer, so that sidewalls of the insertion layer located at ends of the source region and the drain region are recessed by a preset distance relative to sidewalls of the barrier layer to form a recessed trench, and the recessed trench is in communication with the first groove; and forming a heavily doped material layer in the first groove, wherein the heavily doped material layer fills the first groove and the recessed trench.

14. The manufacturing method of a semiconductor structure according to claim 13, after forming the heavily doped material layer in the first groove, further comprising:

forming a gate on the barrier layer; and forming a source and a drain on the heavily doped material layer, wherein the source and the drain are located on opposite sides of the gate.

15. The manufacturing method of a semiconductor structure according to claim 13, wherein forming the barrier layer on a surface of a side of the channel layer facing away from the substrate and forming the insertion layer in the barrier layer comprises:

forming a first barrier sublayer on the surface of the side of the channel layer facing away from the substrate;

forming the insertion layer on a surface of a side of the first barrier sublayer facing away from the substrate; and forming a second barrier sublayer on a surface of a side of the insertion layer facing away from the substrate, wherein the barrier layer comprises the first barrier sublayer and the second barrier sublayer.

16. The manufacturing method of a semiconductor structure according to claim 13, wherein laterally etching the sidewall of the insertion layer to form the recessed trench comprises:

selectively laterally etching the sidewall of the insertion layer in a direction of a channel width of the channel structure to form at least one finger-shaped trench, wherein the at least one finger-shaped trench is arranged at intervals in the direction of the channel width; and when forming the heavily doped material layer in the first groove, the method further comprises:

laterally growing the heavily doped material layer, so that the heavily doped material layer fills at least one first sub-trench to form at least one protrusion.

17. The manufacturing method of a semiconductor structure according to claim 13, wherein forming the heavily doped material layer in the first groove comprises:

forming a heavily doped material layer of a single material layer or a heavily doped material layer of a laminated material layer in the first groove.

18. The manufacturing method of a semiconductor structure according to claim 13, wherein forming the insertion layer in the barrier layer comprises:

forming a plurality of insertion layers in the barrier layer, wherein in a direction perpendicular to the substrate, the plurality of insertion layers are disposed at intervals in sequence.

19. The manufacturing method of a semiconductor structure according to claim 13, wherein forming the channel structure on the side of the substrate comprises:

forming a plurality of channel structures on the side of the substrate, wherein the plurality of channel structures are stacked on the side of the substrate in sequence.

20. The manufacturing method of a semiconductor structure according to claim 19, wherein etching the channel structure to form the first groove comprises:

etching the plurality of channel structures, so that in a direction where the substrate points to the channel layer of each of the channel structures, lengths of the plurality of channel structures sequentially decrease.

* * * * *